United States Patent [19]

Yamanouchi

[11] Patent Number: 4,581,316
[45] Date of Patent: Apr. 8, 1986

[54] METHOD OF FORMING RESIST PATTERNS IN NEGATIVE PHOTORESIST LAYER USING FALSE PATTERN

[75] Inventor: Kazuaki Yamanouchi, Iwate, Japan

[73] Assignee: Fujitsu Limited, Kawasaki, Japan

[21] Appl. No.: 701,810

[22] Filed: Feb. 19, 1985

Related U.S. Application Data

[63] Continuation of Ser. No. 551,500, Nov. 14, 1983, abandoned, which is a continuation of Ser. No. 428,600, Sep. 30, 1982, abandoned, which is a continuation of Ser. No. 207,736, Nov. 17, 1980, abandoned.

[30] Foreign Application Priority Data

Nov. 28, 1979 [JP] Japan .................. 54-154013

[51] Int. Cl.4 .................. G03F 7/26; H01L 21/00
[52] U.S. Cl. .................. 430/296; 430/5; 430/22; 430/311; 430/312; 430/325; 430/329; 430/396; 430/494; 430/952; 430/967; 430/269
[58] Field of Search ............... 430/312, 311, 325, 328, 430/329, 320, 321, 269, 232, 22, 5, 296, 967, 952, 396, 494

[56] References Cited

U.S. PATENT DOCUMENTS

| | | | |
|---|---|---|---|
| 2,039,412 | 5/1936 | Heise | 430/328 |
| 3,249,436 | 5/1966 | Halpern | 430/269 |
| 3,403,024 | 9/1968 | Luce | 430/269 |
| 3,653,898 | 4/1972 | Show | 430/312 |
| 4,256,829 | 3/1981 | Daniel | 430/312 |

FOREIGN PATENT DOCUMENTS 2143737 3/1973 Fed. Rep. of Germany .
1112405 5/1968 United Kingdom .

*Primary Examiner*—Charles L. Bowers, Jr.
*Attorney, Agent, or Firm*—Staas & Halsey

[57] ABSTRACT

In a method of forming very minute real window patterns to a negative photoresist film that are required in the manufacture of highly packed semiconductor devices, false unexposed patterns are formed in the proximity of the minute real unexposed patterns. The false patterns have a width that, upon a single exposure of the negative photoresist film to ultraviolet light or other energy beam, the photoresist film portion immediately below the false patterns are unexposed but a photoresist portion under the unexposed portion is exposed to light by reason of light diffraction or light circling around under the false pattern. As a result, the false patterns in the photoresist film substantially disappear after development of the photoresist. The partially removed false patterns serve to negate swelling of the photoresist at the time of development and prevent obliteration of the real window patterns or formation of burr-like parts where the real window patterns are to be formed.

21 Claims, 11 Drawing Figures

METHOD OF FORMING RESIST PATTERNS IN NEGATIVE PHOTORESIST LAYER USING FALSE PATTERN

This is a continuation of copending application Ser. No. 551,500 filed on Nov. 14, 1983, now abandoned, which is a continuation of application Ser. No. 428,600 filed Sept. 30, 1982 abandoned, which is a continuation of application Ser. No. 207,736 filed Nov. 17, 1980, now abandoned.

BACKGROUND OF THE INVENTION

The present invention is directed to a method of forming patterns to a negative photoresist in the manufacture of semiconductor devices or the like, and more particularly, to a method of forming false patterns near a real pattern on a negative photoresist in accordance with which etching is to be carried out.

In recent years, semiconductor devices have become highly integrated, and keeping pace therewith, unit elements in a semiconductor chip provided by advanced technology are extremely miniaturized. Various patterns employed in the manufacture of such chips are accordingly prepared very minutely. As is generally practiced in the industry, a photoresist light sensitive emulsion is utilized in the formation of various impurity diffusion and electrode contact regions in manufacturing semiconductor devices. The photoresist emulsion is coated on the surface of the oxidized silicon slice or wafer, and for example, the slice is then heated to remove solvents. A photographic mask is accurately aligned using a jig, and is placed in contact with the photoresist film which is then partially exposed to ultraviolet light through the mask. Using a photoresist developer, desired patterns are formed in the photoresist film. Using such patterned photoresist film, a silicon oxide or silicon nitride film formed on the surface of the silicon slice is selectively removed to form an impurity diffusion mask or to define contact regions for the semiconductor device.

There are two kinds of photoresist light sensitive emulsions. One is a negative type, wherein the photoresist emulsion has the property of becoming less soluble in its developer wherever it is polymerized by exposure to ultraviolet radiation. Unexposed areas under opaque parts of the mask coated with chrome can be selectively removed with the photoresist developer. The remaining resist is usually hardened through post-baking and acts as a convenient mask through which the oxide or nitride layer can be etched away. The other kind of photoresist emulsion, namely a positive type emulsion, is utilized in exactly the same manner. However, windows are opened wherever the mask is transparent due to the property that resist areas exposed to ultraviolet light become soluble and can be removed by a photoresist developer. Since negative photoresist emulsions can be processed more quickly than positive photoresist emulsions in most cases, the present invention is directed to a negative photoresist film.

In FIG. 1, a mode to carry out the conventional method of forming patterns is illustrated. A photographic mask 1 made of transparent glass 2 has on its surface a pattern provided by an opaque material 3, such as chrome. The mask 1 is placed on a photoresist film 4 formed on an oxide layer 5, which in turn is formed on a semiconductor substrate 6. By irradiating light from above, areas of the film 4 (other than the area beneath the pattern of opaque material film 3) are exposed to light. The area beneath the pattern 3 remains unexposed.

When the unexposed photoresist is removed by a developer which is, for example, a developer mainly comprising xylene, a photoresist film 4 having a pattern as shown in FIG. 2 is formed on the oxide layer 5. By a subsequent etching process, the oxide layer 5 having a desired pattern remains on the semiconductor substrate 6, and steps for diffusion and formation of contacts are carried out thereafter to provide a semiconductor device.

Often times, it becomes necessary to prepare through a photoresist film 4 a very narrow opening or window 3' as shown in FIG. 3. Recent demand for miniaturize integrated circuits often requires that the lateral width as seen in the drawing be less than 3 $\mu$m. In such a case, a mask 1 (FIG. 4) having a plate 2 with a pattern 3, which corresponds to the opening 3' of FIG. 3, is generally used in a manner illustrated in FIG. 1. With any conventional negative photoresist, for example, a negative photoresist in the family of isopropyrene, a so-called swelling of the photoresist occurs during its development process because the exposed and polymerized photoresist is essentially soluble in the developer. Ordinarily, this swelling is caused to shrink by the use of a further rinsing solution, for example, butyl acetate, and a desired pattern can be prepared. However, if the width of the pattern is extremely narrow, photoresist at both sides of the formed pattern adheres to each other at the time of development as shown in FIG. 5A. Even if the rinsing solution is used thereafter, the photoresist is not separated as shown in FIG. 5B. As a result, the pattern is obliterated or burr-like parts are formed.

This swelling of the photoresist depends on the thickness of the photoresist and area of the opening. Accordingly, where the width of an opening of the photoresist film to be formed is approximately 3 $\mu$m, with the thickness of the photoresist in the order of 8,000 to 10,000 Å, the pattern is lost or burr-like parts appear if the opening 3' is isolated from other openings of the photoresist film, as illustrated in FIG. 3, due to the swelling of the photoresist.

SUMMARY OF THE INVENTION

In the course of investigating the adverse effects of swelling of the photoresist described above, it was found that, if there are other openings 3" near the opening 3' as shown in FIG. 6, swelling of the photoresist can be absorbed in these openings 3", and thus such openings 3 serve to prevent problems, such as obliteration of the opening 3' mentioned before.

It is therefore the general object of the present invention to offer a method of forming a fine opening of a negative resist film without obliteration of the required opening or formation of burr-like parts, as experienced in the prior art and which tend to present the difficult problems described above in cases where minute patterns must be formed in areas as shown in FIG. 3.

The other object of the present invention is to provide a method for forming a fine opening of a negative photoresist film without complicating the process as compared to the conventional process.

In an embodiment of the invention, a conventional negative photoresist is used. In one manufacturing method of a semiconductor device involving formation of patterns comprising the steps of performing a single partial exposure of a negative photoresist film by ultraviolet light through a photographic mask, developing the photoresist and rinsing same. A photographic mask is prepared according to the invention in such a manner that there are provided, in addition to a real pattern corresponding to a desired pattern of the photoresist, false patterns, in the neighborhood of the real pattern, each having such a width that a through-hole cannot be formed in the photoresist film by said false pattern due to the effect of light circling around under the false pattern at the time of exposure to light and/or the effect of the swelling of the photoresist.

The above and further objects and novel features of the invention will appear more fully from the following detailed description when read in connection with the accompanying drawings. It is to be expressly understood, however, that the drawings are not intended as a definition of the invention but are for the purpose of illustration only.

BRIEF DESCRIPTION OF THE DRAWINGS

In the drawings wherein like parts are marked alike.

DESCRIPTION OF THE PREFERRED EMBODIMENT

Figure 7:
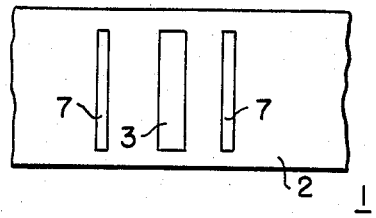
FIGS. 7 and 10 are plane views and FIGS. 8 and 9 are cross-sectional views showing steps to carry out the method of the present invention.

To carry out the preferred embodiment of the invention, a photographic mask as shown in FIG. 7 is used. In this mask, there are formed, in the neighborhood of a real pattern 3 which corresponds to a desired pattern to be formed to the photoresist film, false patterns 7 of a width much narrower than that of real pattern 3. In the industry, the minimum width of the real pattern 3 is currently in the order of 2 to 3 $\mu$m. By making the width of each of the false patterns 7 is in the range of less than, or at most equal to, 1 $\mu$m, at the time of exposure of the photoresist to light, light would, in the thickness of the photoresist, circle around beneath the false pattern 7 due to a diffraction effect, thus preventing formation of a through-hole in the photoresist film. Where the real pattern 3 has a width in the order of 2 to 3 $\mu$m as described above to meet recent requirements for highly packed integrated circuits, the thickness of photoresist film is in the range of 8,000 to 10,000 Å. It would be very difficult to prepare the photoresist film thinner than the above thickness if formation of pinholes is to be prevented.

In the foregoing description, the terms "real pattern" and "false pattern" are used to denote the fact that, whereas the pattern 3 is provided to function as a pattern for forming an opening or window of a photoresist film in the sense now understood in the art, the patterns 7 are provided only for the purpose of dealing with swelling of the photoresist, and no such patterns should appear that go through the photoresist. These terms are to be read in this sense in the description of the invention as well as in the claims.

Figure 1:
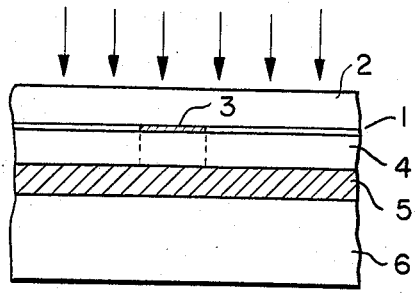
FIGS. 1 and 2 are cross-sectional and plane views showing steps to carry out the conventional method of forming a pattern to a photoresist film.
Figure 2:
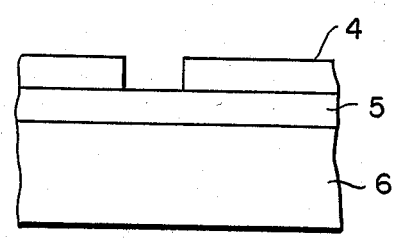
Figure 3:
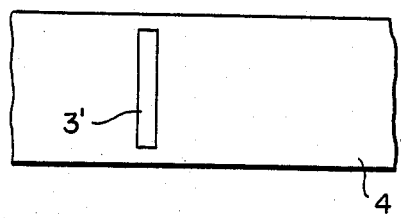
Figure 4:
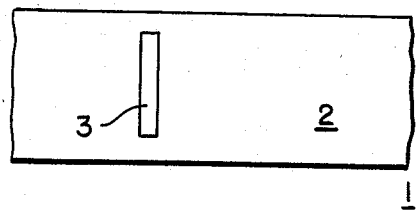
Figure 5A:
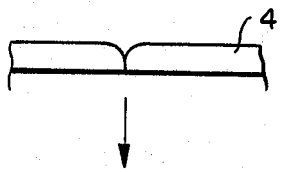
FIGS. 5A and 5B are cross-sectional views which illustrate problems experienced in the art.
Figure 5B:
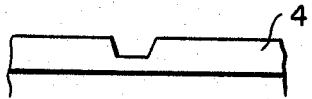
Figure 6:
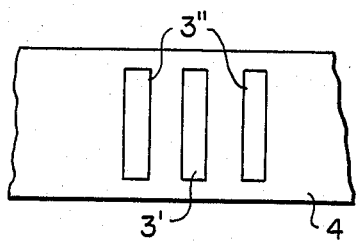
FIG. 6 is a plan view illustrating a plurality of pattern openings formed in a photoresist resulting in an absorption of the swelling in the photoresist.
Figure 8:
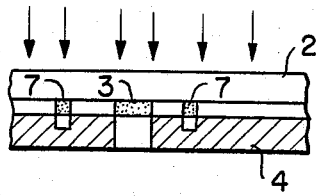
Figure 9:
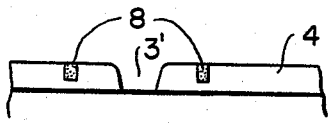

A single partial exposure of the photoresist to light is carried out as shown in FIG. 8 using the photographic mask just described. FIG. 8 is a similar type drawing to FIG. 1, but for the purpose of clarification, the semiconductor substrate and oxide film thereon are omitted. In FIG. 8, it should be understood that, for the negative photoresist film 4, the hatched photoresist area is the part exposed to light and the part without any hatchings is the photoresist area not exposed. The photoresist beneath the pattern 3 is entirely unexposed. However, the photoresist beneath each pattern 7 according to the invention has an unexposed portion immediately below the pattern and a portion beneath said unexposed portion that is exposed to light by reason of light circling around beneath the unexposed part or by light diffraction. And thus, as illustrated in FIG. 9, a part 3' of the photoresist corresponding to the real pattern 3 is removed, but a part 8 of the photoresist corresponding to each false pattern 7 is only partially removed in the developing process, and formation of a through-hole in the photoresist film at part 8 is avoided. Swelling of the photoresist at the time of development which was described before is absorbed in this partially removed part 8, and thus effectively decreases the change in size of the window 3' due to swelling of the photoresist. As a result, obliteration of the pattern or formation of burr-like parts at part 3' is prevented. After the development, a rinsing process may be carried out as in the conventional manner.

The width of each false pattern 7 prepared in accordance with this embodiment of the invention is so determined as to allow light to circle around beneath patten 7 in order to provide a partially exposed photoresist. A width for pattern 7 in the order of 1 $\mu$m is preferable in the current practice of the invention. However, a partially exposed part is not absolutely necessary provided that a through-hole is not formed in the photoresist as a result of exposure to light, development and rinsing. In other words, the part of the photoresist corresponding to the false pattern may remain entirely unexposed if it is so narrow that swelling of the photoresist in the succeeding development process obliterates the unexposed false pattern and thus prevents formation of a through-hole even after the rinsing step.

Patterns 7 are formed near the pattern 3 as illustrated in FIG. 7. In the embodiment shown, the width (w) of the pattern 3 is in the order of 2 to 3 $\mu$m, and the distance or spaced (d) between the patterns 3 and 7 in the range of 2 to 15 $\mu$m. If the distance between patterns 3 and 7 is less than 2 $\mu$m, the thickness of the photoresist film between the patterns 3 and 7 becomes thin, and the film in that region does not perform the function of a photoresist film properly. If the distance between patterns 3 and 7 is more than 15 $\mu$m, the effect of suppressing swelling in the opening 3' of the photoresist, which is the object of the invention, could hardly be expected. The most preferable range of the distance between patterns 3 and 7 is 5 to 7 $\mu$m in this embodiment. These values are selected relative to the photoresist film having a thickness in the order of 8,000 to 10,000 Å is now generally practiced in the industry. If the photoresist film is thicker, the distance in question should be made shorter.

Figure 10:
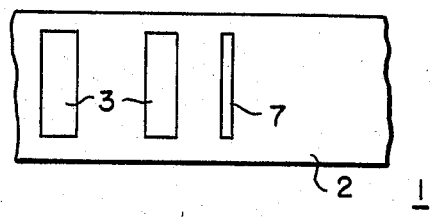

Experiments confirmed that the effectiveness of the false pattern according to the present invention depends on the distance d between the false and real patterns in relation to the width w of the real pattern, and the preferable range of the distance d is from w to 5w. The most preferable range of the distance d is 2w to 3w. Therefore, the false pattern may be omitted when there is another real window pattern in the above distance range from the first real window pattern. For example, where two real window patterns 3 are formed proximately as shown in FIG. 10 (e.g., the illustrated distance between patterns 3 is about 2w), only one false pattern 7 may be formed at one side of the intermediate or middle window pattern 3 opposite to the other or left-hand side pattern 3.

Significant advantages are achieved by the method of the present invention because it does not require any additional process step which would complicate the process while assuring formation of a minute window pattern for a negative photoresist. In the foregoing description, the negative photoresist is exposed to light, usually ultraviolet light. However, the scope of the invention is not limited to cases where ultraviolet light is employed. Where an energy beam, such as an X-ray or an electron beam, is used, the method of the invention is just as effective as where ultraviolet light is employed. When an X-ray or electron beam is employed in the exposure process of the photoresist, its diffraction is negligible because the wave length of an X-ray or electron beam is much shorter than that of ultraviolet light. Therefore, in carrying out the method of the present invention with an X-ray or electron beam exposure process, unexposed portions of a negative X-ray or electron beam resist corresponding to the false pattern described above are provided, again near an unexposed portion where a real window is to be formed. In this case, the false unexposed pattern disappears during the development process, absorbing the swelling of the resist.

It should be noted that the principle of the method of the present invenion is to provide, in the single exposure process of a photoresist near a real pattern, a false pattern which is formed very minutely so that the false pattern substantially disappears in the developed resist film while absorbing the swelling of the resist during the development process. Thus, the method of the invention enables formation of fine real patterns in the photoresist film which are very much required in the manufacture of highly packed integrated circuits. In addition, the fact that minute real patterns can be actually formed as designed contributes substantially in improving reliability of the manufactured semiconductor devices.

Thus, the invention having been described in its best embodiment and mode of operation, that which is desired to be protected by Letters Patent is:

1. A method for forming an opening having a width of approximately 3 $\mu$m or less to a negative photoresist film comprising the steps of:
performing a single partial exposure to a negative photoresist film to form first and second unexposed portions of said photoresist film, said first unexposed portion corresponding to said opening and said second unexposed portion being disposed proximately to said first portion, and
developing said photoresist film to selectively remove said first and second unexposed portions to form said opening at said first unexposed portion of said photoresist film, said second unexposed portion being separated from and parallel with said first unexposed portion, having a width minute enough to prevent formation of a through-hole thereat and being disposed closely enough to said first unexposed portion to prevent said opening from being obliterated in the developing step by absorbing swelling of the negative photoresist film at said second unexposed portion.

2. The method of claim 1 further comprising the step of rinsing said resist film after said developing step.

3. The method of claim 1 wherein the first and second portions of said resist film are formed in said exposing step at a distance d, between the first portion having a width w and the second portion, in the range of w to 5w.

4. The method of claim 1 wherein said resist film is partially exposed to ultraviolet light through a photographic mask.

5. The method of claim 1, wherein the distance between said first and second portions is in the range of 2 to 15 $\mu$m.

6. The method of claim 5 wherein said photoresist film has a thickness in the range of 8,000 to 10,000 Å.

7. The method of claim 5 wherein said first portion has a width of approximately 3 $\mu$m or less.

8. The method of claim 7 wherein said second portion has a width of approximately 1 $\mu$m or less.

9. The method of claim 8 wherein said photoresist film has a thickness in the range of 8,000 to 10,000 Å.

10. The method of claim 4 wherein said photographic mask has false patterns and real patterns to respectively form said first and second portions of said photoresist film.

11. The method of claim 10 wherein said false patterns have a width determined to allow light to partially circle beneath said false patterns during the exposing step for forming said second unexposed portions immediately below said false patterns and exposed areas of said photoresist film beneath said second unexposed portions.

12. The method of claim 1 wherein said photoresist film is a negative X-ray photoresist film and is partially exposed to an X-ray through a mask.

13. The method of claim 1 wherein said photoresist film is an electron beam resist and is partially exposed to an electron beam through a mask.

14. The method of claim 1 wherein said required opening to be formed in said resist film is not in proximity to another required opening to be formed in said photoresist film.

15. A method for forming a required opening to a negative photoresist film in the manufacture of an integrated semiconductor device comprising the steps of:
(a) performing a single partial exposure to a negative photoresist film having a thickness in the range of 8,000 to 10,000 A using a mask having false and real patterns in proximity to one another to form first and second unexposed portions, said first unexposed portion formed having a width of approximately 3 $\mu$m or less under said real pattern to correspond to said required opening and said second unexposed portion formed having a width of approximately 1 $\mu$m or less under said false pattern at a distance to said first unexposed portion of 2 to 15 $\mu$m; and
(b) developing said photoresist film to selectively remove said first and second unexposed portions, said first portion being removed to form said required opening of a width of approximately 3 $\mu$m or less in said film and said second portion having said width minute enough to prevent formation of a hole through said photoresist film and being disposed at said distance to said first unexposed portion to prevent said opening from being obliterated in the developing step by absorbing swelling of the negative photoresist film at said second unexposed portion.

16. The method of claim 15 wherein said required opening to be formed in said photoresist film is not in proximity to another required opening to be formed in said photoresist film.

17. The method of claim 15 wherein said false patterns have a width determined to allow light to partially circle beneath said false patterns during the exposing step for forming said second unexposed portions immediately below said false patterns and exposed areas of said photoresist film beneath said second unexposed portions.

18. The method of claim 15 wherein the first and second portions of said photoresist film are formed in said exposing step at a distance d, between the first portion having a width w and the second portion, in the range of w to 5w.

19. The method of claim 15 wherein said photoresist film is partially exposed to ultraviolet light through a photographic mask.

20. The method of claim 15 wherein said photoresist film is a negative X-ray photoresist film and is partially exposed to an X-ray through a mask.

21. The method of claim 15 wherein said photoresist film is an electron beam photoresist film and is partially exposed to an electron beam through a mask.

* * * * *

UNITED STATES PATENT AND TRADEMARK OFFICE
CERTIFICATE OF CORRECTION

PATENT NO. : 4,581,316

DATED : April 8, 1986

INVENTOR(S) : Yamanouchi

It is certified that error appears in the above-identified patent and that said Letters Patent is hereby corrected as shown below:

Front Page [56] References Cited, Col. 2, line 2, "Show" s/b --Shaw--.

Col. 2, line 51, "3" s/b --3"--.

Col. 3, line 52, after "of" insert --the--.

Col. 4, line 5, "photoresist area" s/b --part--;

line 6, "part" s/b --photoresist area--;

line 30, "patten" s/b --pattern--;

line 58, after "Å" insert --as--.

Col. 5, line 34, "invenion" s/b --invention--.

Col. 6, line 42, "resist" s/b --photoresist--;

line 50, "A" s/b --Å--.

Signed and Sealed this

Nineteenth Day of August 1986

[SEAL]

Attest:

DONALD J. QUIGG

Attesting Officer     Commissioner of Patents and Trademarks